United States Patent

[19]

Nasila

[11] Patent Number: 5,886,563

[45] Date of Patent: Mar. 23, 1999

[54] INTERLOCKED HALF-BRIDGE CIRCUIT

[76] Inventor: Mikko J. Nasila, 48C Hampshire Dr., Noshua, N.H. 03063

[21] Appl. No.: 823,343

[22] Filed: Mar. 24, 1997

Related U.S. Application Data

[60] Provisional application No. 60/014,045, Mar. 25, 1996.
[51] Int. Cl.[6] .......................... H03K 3/33; H03K 17/60
[52] U.S. Cl. .......................... 327/423; 327/424; 327/427; 327/430; 327/436; 327/437; 327/587
[58] Field of Search ...................... 327/539, 540, 327/541, 100, 112, 423, 424, 427, 430, 431, 432, 434–437, 587, 588

[56] References Cited

U.S. PATENT DOCUMENTS

| | | | |
|---|---|---|---|
| 4,685,040 | 8/1987 | Steigerwald et al. | 363/17 |
| 4,698,519 | 10/1987 | Cini et al. | 307/254 |
| 4,967,332 | 10/1990 | Claydon et al. | 363/17 |
| 5,113,087 | 5/1992 | Ueno | 307/263 |
| 5,155,670 | 10/1992 | Brian | 363/24 |
| 5,245,520 | 9/1993 | Imbertson | 363/17 |
| 5,281,862 | 1/1994 | Ma | 307/270 |
| 5,315,263 | 5/1994 | Mudra et al. | 330/156 |
| 5,386,118 | 1/1995 | Wilcox | 327/109 |
| 5,438,498 | 8/1995 | Ingemi | 363/17 |
| 5,502,632 | 3/1996 | Warmerdam et al. | 363/98 |

*Primary Examiner*—Tim Callahan
*Assistant Examiner*—An T. Luu
*Attorney, Agent, or Firm*—Scott J. Asmus; Vernon C. Maine

[57] ABSTRACT

A half-bridge circuit where the transistors comprising the half-bridge are electronically interlocked—precluding cross-conduction; and high-side voltage generation and logic level translation are integral to the interlock mechanism.

9 Claims, 8 Drawing Sheets

INTERLOCKED HALF-BRIDGE CIRCUIT

This is a continuation-in-part application to U.S. provisional patent application Ser. No. 60/014,045, filed Mar. 25, 1996, by the same inventor.

BACKGROUND OF THE INVENTION

1. Technical Field of the Invention

This invention relates to the field of power electronics. In particular, the present invention relates to inverter circuits used universally in electronic power applications.

2. Background Art

Half and full-bridge topologies are extensively applied in power electronics. Implementing these architectures requires attention to high-side GATE voltage generation, high-side logic level signal translation, and prohibiting simultaneous transistor conduction shoot-through, or cross-conduction. Satisfying these requirements impacts circuit complexity, reliability, and switching performance.

Ideal Traditional Half-Bridge

Illustrated in FIG. 1, is an ideal traditional half-bridge phase leg comprised of Q1 and Q2, with essential control functions contained within the dashed block. Although other techniques are available, the dashed block illustrates the current industry approach to interfacing to these transistors.

Employing all N-channel Metal Oxide Silicon Field Effect Transistors (N-MOSFETs), as illustrated, as opposed to complementary N/P-channel output stage transistors, is preferred due to their higher conductivities. Also, this discussion does not preclude the use of other switching devices, such as bipolar transistors, or IGBs; but merely prefers N-MOSFETs due to their predictable switching characteristics.

However, N-MOSFET devices require a GATE voltage more positive than the SOURCE voltage in order to turn ON, when the SOURCE will be at about VDD. VDD may range from zero to greater than 1000 volts, depending on the specific application. So this circuit requires either the availability, or the generation of a voltage about 10–15 v greater than the VDD rail. This is provided by the 'HIGH-SIDE GATE VOLTAGE' block.

MOSEFTs are currently manufactured with voltage breakdown ratings in excess of 1000 volts, whereas logic circuits operate at less than 15 volts. Therefore, the designer must contend with controlling the GATE of a MOSFET which is at a voltage incompatible with ordinary logic circuits. This explains the need for the 'LOGIC LEVEL TRANSLATION' block.

The Achilles' heel of any half-bridge topology is the threat of simultaneous conduction of both ((output)) transistors. If this condition were to occur, damaging currents would flow through Q1 and Q2. Therefore, the designer must guard against this condition by providing a 'deadtime' interval, during which both transistors are guaranteed to be OFF. Implementing this deadtime (a measure of the designer's conservatism) increases both the complexity, and the minimum cycle time of the circuit. This explains the need for the 'TURN-ON DELAY' block.

SUMMARY OF THE INVENTION

It is an object of the invention to provide high speed electronic commutation for power conversion, where a break-before-make sequence of switching of output transistors is assured.

In the circuit to be described, the transistors comprising the half-bridge are electronically interlocked—precluding cross-conduction; and high-side voltage generation and logic level translation are integral to the interlock mechanism. This circuit is simple, robust, and as fast as physics permits.

Ideal Interlocked Half-Bridge

Illustrated in FIG. 2 is an Ideal Interlocked Half-Bridge schematic. Q1, and Q2 combine to form a half-bridge phase leg. Diode CR2 provides reverse isolation from the GATE to SOURCE of Q1, while permitting forward current through Q2. Observe that If Q2 is conducting, Q1 will be biased OFF through CR2; and that if Q2 is OFF, Q1 will be permitted to conduct, provided it is biased ON. Therefore, the conduction of Q1 and Q2 are mutually exclusive.

C1 and R1 provide a bias network for Q1. Any charge stored in C1 would be transferred to the GATE of Q1, provided Q2 is OFF. A means of charging C1 is provided by the circuitry consisting of Q3 and CR3, along with Q2 and CR2.

Q3, a P-channel MOSFET needing only about a 20 v breakdown rating, but with conductivity similar to Q1 and Q2, shares a common GATE with Q2, INPUT; while the SOURCE of Q3 is at VGG, and the SOURCE of Q2 is at VSS.

In this configuration, if INPUT is at VGG, then Q3 will be OFF, and Q2 will be ON; if INPUT is at VSS, then Q3 will be ON, and Q2 will be OFF; and if INPUT is in transition, then both Q2 and Q3 will be ON. This normally undesirable condition, called 'shoot-through', is utilized in this circuit to provide a very high power pulse to charge C1. This pulse begins with Q3 turning ON, and ends with Q2 turning OFF. The required duration of this pulse can be tailored by the designer to suit specific circuit components by controlling the rate of change of INPUT.

By blocking reverse current, CR1, along with C1 form a 'bootstrap' circuit for generating an 'over the rail voltage'. Together, these perform the 'HIGH-SIDE GATE VOLTAGE' block employed in traditional half-bridge circuits. CR1 must be selected in order to sustain VDD across it, while maximizing switching speed and minimizing reverse recovery losses.

By virtue of the fact that a value of about VGG is stored in C1, and that this charge will be transferred to the GATE of Q1 through R1 to Q1 once Q2 is OFF; this arrangement performs the 'LOGIC-LEVEL TRANSLATION' block employed in traditional half-bridges.

In effect, we store a charge in C1, which serves as both the power, and the signal, to turn Q1 ON. This charge, with one foot firmly anchored in the SOURCE of Q1 will be buoyed aloft with Q1, and isolated from it's nascence by CR3— hence 'bootstrap'.

Because Q1 and Q2 are intimately interlocked, Q1 and Q2 cannot conduct simultaneously. Therefore, this interlock supersedes, or obviates the circuitry associated with 'DEADBAND GENERATION', of traditional half-bridges.

Prior to an INPUT HIGH to LOW transition interval, Q3 will be OFF, Q1 will be OFF, and Q2 will be ON, keeping OUTPUT LOW, and bearing the full load through CR2. As INPUT transits from VGG to VSS, Q3 will turn ON and, through CR3, applies VGG to one side of C1; while Q2, through CR2 is clamping the other side of C1 to VSS. Thus C1 will charge to VGG-VSS within the impedance constraints of the circuit.

The charge on C1 is intended to provide high-side GATE drive power for Q1, along with the high-side logic level translation. However, while Q2 is still ON, this charge will be shunted to VSS, keeping Q1 OFF. Once Q2 turns OFF, CR2 will isolate Q1 GATE from it's SOURCE, and C1 charge will flow undiverted to the GATE of Q1, and turn it ON. Once Q1 begins conducting, VDD will begin to be applied to its SOURCE. As this occurs, C1 will maintain 'bootstrap' Q1 voltage. The voltage at the GATE of Q1 and the cathode of CR3 will rise to VDD+V(C1), CR3 is provided to block this voltage from Q3.

Assuming the final condition in the preceding paragraph, as INPUT transits from VSS to VGG, Q2 will turn ON almost immediately. Q2 will discharge the GATE of Q1, turning it OFF. Once Q2 has forced Q1 GATE to less than it's SOURCE, CR2 will begin conducting, and Q2 will have again assumed the full load, through CR2. Q3 will remain ON until INPUT has reached a level to turn it OFF. CR1 is provided to shunt sinking inductive currents to VSS, which would otherwise be blocked by CR2. At the completion of this transition, Q2 will be ON; and Q1, and Q3 will be OFF. The time required to complete this transition is determined only by the current capacity of INPUT to charge the GATE of Q2.

Still other objects and advantages of the present invention will become readily apparent to those skilled in this art from the following detailed description, wherein I have shown and described only a preferred embodiment of the invention, simply by way of illustration of the best mode contemplated by me on carrying out my invention.

DESCRIPTION OF THE PREFERRED EMBODIMENT

As will be realized, the invention is capable of other and different embodiments, and its several detail are capable of modification in various obvious respects, all without departing from the invention.

A Practical Interlocked Half-Bridge Circuit

Figure 1:
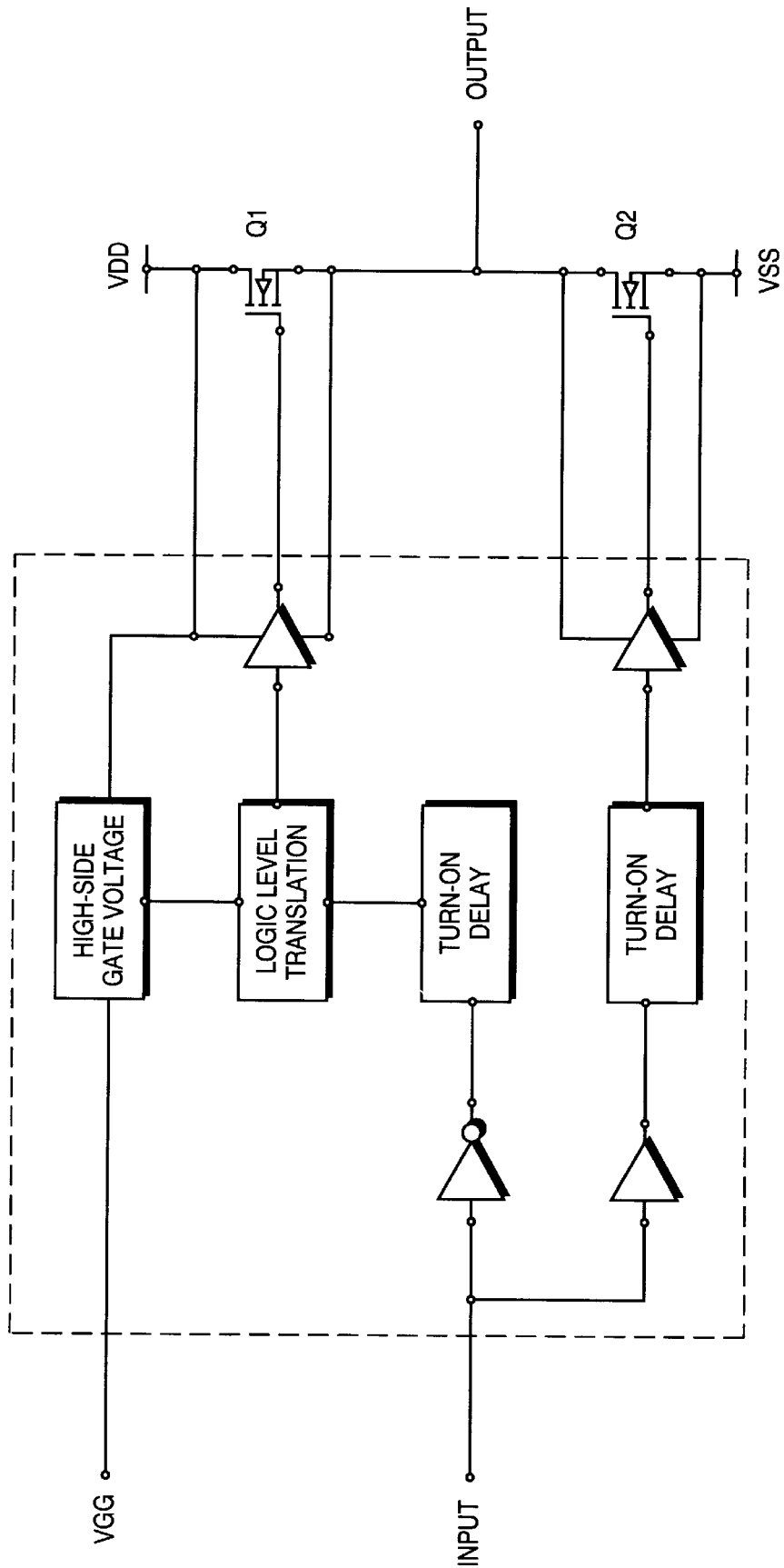
FIG. 1 is a simplified schematic/block diagram of an ideal traditional half-bridge circuit, with the dashed block illustrating the prior art approach to interfacing to these transistors.
Figure 2:
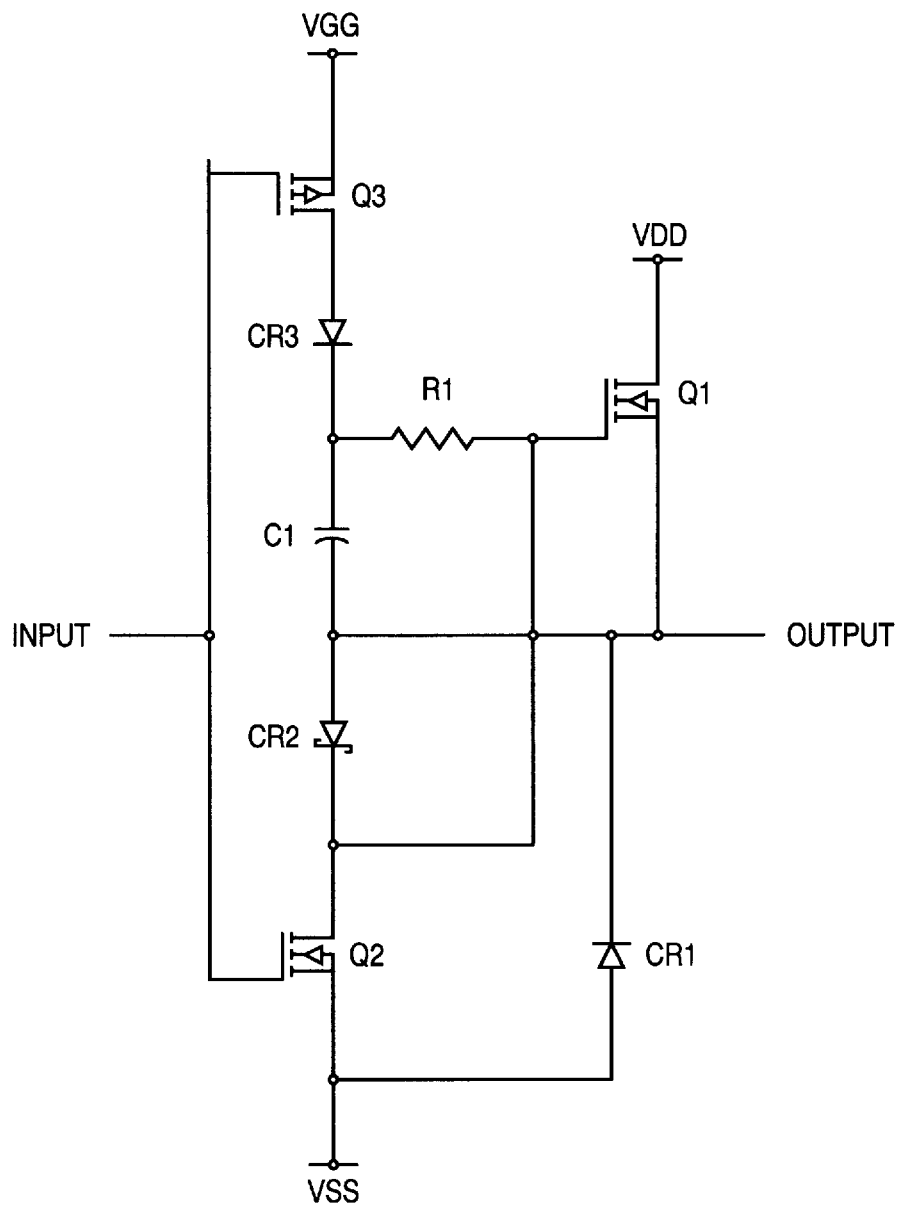
FIG. 2 is a schematic of an idealized interlocked half-bridge circuit of the invention, where all control functions illustrated in FIG. 1 are contained within the circuit, along with the power output of the half-bridge.
Figure 3:
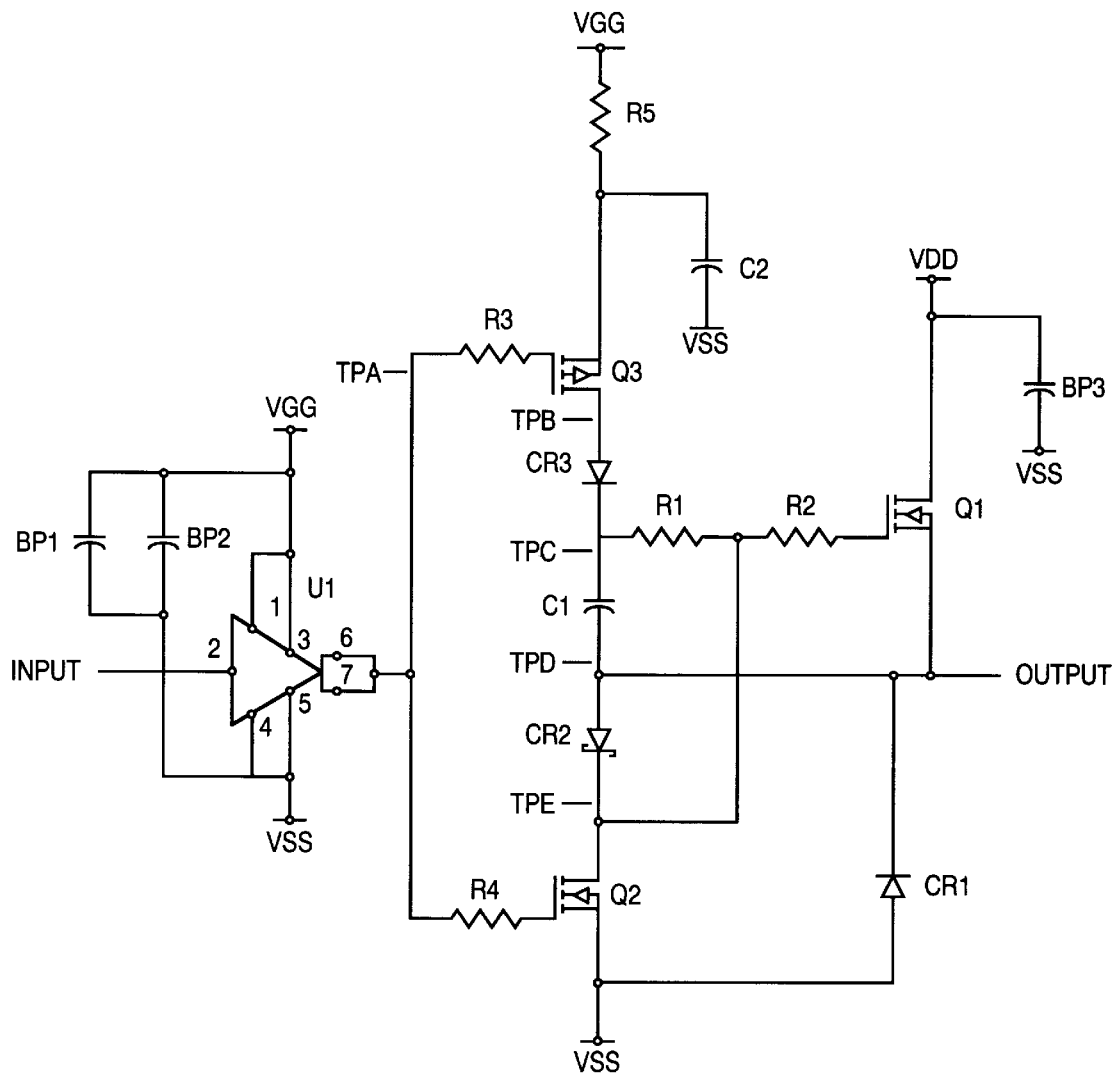
FIG. 3 is a schematic of a preferred embodiment of the interlocked half-bridge circuit of the invention.

A preferred embodiment illustrating the principles of the invention is herein described. The applicant has manufactured this circuit in a mixed technology PCB, as shown in FIG. 3 (A mixed technology circuit employs both through-hole and surface mount parts). In addition to the components described in the ideal circuit of FIG. 2, the FIG. 3 circuit incorporates ancillary components in the form of gate resistors, decoupling capacitors, and swamping resistors.

A listing of the component values and functions in the circuit of FIG. 3 follows:

BP1: 0.1 uF 50 v ceramic surface mount Bypass Capacitor. This circuit needs to be driven HARD! (see U1, below), and it responds accordingly. So judicious decoupling is in order.

BP2: 1.0 uF 50 v ceramic surface mount capacitor.

BP3: 0.22 uF 200 v polypropylene capacitor. Although there is no 'shoot-through' per-se in this circuit, a 160 v high speed switching event will disrupt the VDD rail, and the designer must ensure that adequate decoupling is provided to prevent voltage transients on the VDD rail which may damage components (specifically Q1).

C1: 0.015 uF 50 v ceramic surface mount bootstrap capacitor. This component provides both bootstrap voltage generation, along with signal translation. Therefore, this component must be able to store sufficient charge to turn Q1 ON under all operating conditions, while sustaining other losses such as CR3 reverse recovery, and distributed parasitic capacitance.

C2: 0.22 uF 50 v ceramic surface mount capacitor. Local charge reservoir. Together with Q2, CR2, C1, CR3, Q3; C2 must complete a tight, low inductance loop for optimum performance. C2 must be sized such that a Q3 switching event does not discharge it unacceptably.

CR1: MLR820 8A 200 V fast recovery TO220 package. When Q2 turns ON, initiating an OUTPUT HIGH-TO-LOW transition, Q2 initially ONLY discharges the GATE of Q1. Inductive loads at this instant will be sourcing, that is, current will flow out of the load and into the half-bridge circuit. With Q1 turned OFF, the only avenue for this current is through CR1. CR1 will sustain the full load until inductive currents are reversed, and Q2 can pick-up the load through CR2.

CR2: MBR1045 10A 45 v Schottky TO220 package. With Q1 ON, CR2 provides reverse blocking of current from Q1s SOURCE to GATE. With Q2 ON, provides forward load current conduction, along with Q1 GATE-SOURCE clamping. It is important to specify the reverse leakage current of CR2 since this will determine the permissible Q1 ON duration.

CR3: EC11FS2 1.1A 200 V fast recovery surface mount. Functions as the bootstrap diode. Once Q1 begins to conduct, CR3 isolates the bootstrap capacitor (C1) from it's charge source (VGG). CR3 plays a large part in determining the switching speed of the circuit—therefore, the designer should select CR3 to maximize forward switching speed; while minimizing reverse recovery time, forward voltage drop, and reverse leakage.

R1: 10 ohm 1 watt 2512 surface mount package. R1, along with R2, form the gate resistor for Q1. R1 must be selected high enough to permit C1 to charge to an adequate value, and to minimize the amount of current flowing through CR3 when it switches (to minimize reverse recovery behavior): while low enough to provide a low impedance signal to the GATE of Q1. Bear in mind also that R1 must dissipate the energy stored in C1, along with 'spillover' current while Q2 is shunting current.

R2: 3.3 ohm 0.25 watt 1206 surface mount package. Although mentioned as a gate resistor under the discussion of R1, R2's main function is to spoil any 'Q' resulting from circuit inductance and the junction capacitance's of Q1 and CR2. The designer should bear in mind that because of the high switching speed of the circuit, and that Q1 gets sucked down by it's SOURCE, R2 should have a low enough impedance so Q1's GATE voltage doesn't lag behind the SOURCE enough to forward bias Q1 by virtue of the voltage drop across R2—thus defeating the advantages of this circuit.

R3: 3.3 ohm 0.5 watt 1210 surface mount package. Both R3, and R4 serve as the GATE resistors for Q2 and Q3, respectively. In addition to spoiling the 'Q' as R2 does, R3 and R4 together with their associated gate capacitance's, establish the rise/fall times of Q2 and Q3. Furthermore, the inclusion of R3 and R4 allow load sharing with U1, and thus a smaller package for it.

R4: 3.3 ohm 0.5 watt 1210 surface mount package. See R3, above.

R5: 2.2 ohm 0.25 watt 1206 surface mount package. R5 provides prudent isolation between C2, and VGG.

Q1: IRF640 125 watts, TO220 package, 200 volt breakdown, 0.18 ohms Rds(on), 18 amps continuous. N-channel MOSFET, serves as the high-side half-bridge switching transistor. The voltage and current specifications of the circuit are determined by the corresponding parameters of this component, along with Q2, CR2, and CR1.

Q2: Specifications same as Q1. Serves as the low-side half-bridge switching transistor.

Q3: Si9430DY 1 watt, SO-8 surface mount package, 20 volt breakdown, 0.05 ohm Rds(on), 4.5 amps continuous. P-channel MOSFET, serves as the 'pilot' transistor for Q1. Q3 provides switching of high-side gate power, along with signal insertion. Q3 should be selected to have at least a 20 volt breakdown, to accommodate operation at a VGG of about 15 volts, along with a channel resistance (Rds(on)) similar to Q1 and Q2.

U1: MIC4422 1 watt, DIP-8 package. Serves as the MOSFET gate driver for Q2 and Q3. The MIC4422 accepts most standard logic signals, and converts them into high speed, high current signals suitable for driving logic referenced MOSFETs. Ideally, the output of U1 would switch instantaneously, and the designer could then tailor R3 and R4 to suit specific slew rates. Most manufacturers of high speed devices such as this emphasize the enormous transients generated by this type of switching event, so they stress rigorous analysis of power supply decoupling.

VDD: Drain Voltage Supply=160 Vdc. By industry convention, 'VDD' represents the drain, or plus side of digital, or analog monolithic circuits, and this is usually in the range of 5 to 15 volts. However, as used in this context, 'VDD' represents whatever voltage is applied to the drain of the high-side power transistor; which, from a practical standpoint, may range from 15 to >1000 volts.

VGG: Gate Voltage Supply=15 Vdc

VSS: 0 Vdc (A.K.A. Ground). By industry convention, 'VSS' represents the source, or minus side of digital, or analog monolithic circuits. Depending on circuit topology, this may be a minus voltage, or ground.

Figure 4A:
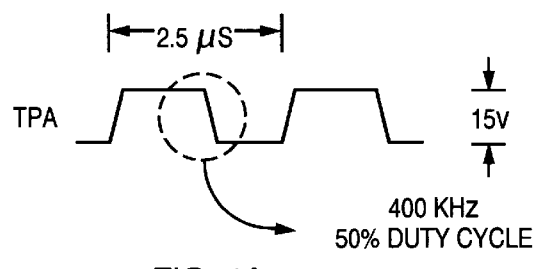
FIG. 4 is a graph of the voltage waveforms at specified points in the circuit of FIG. 3 showing an INPUT HIGH-to-LOW event.
Figure 4B:
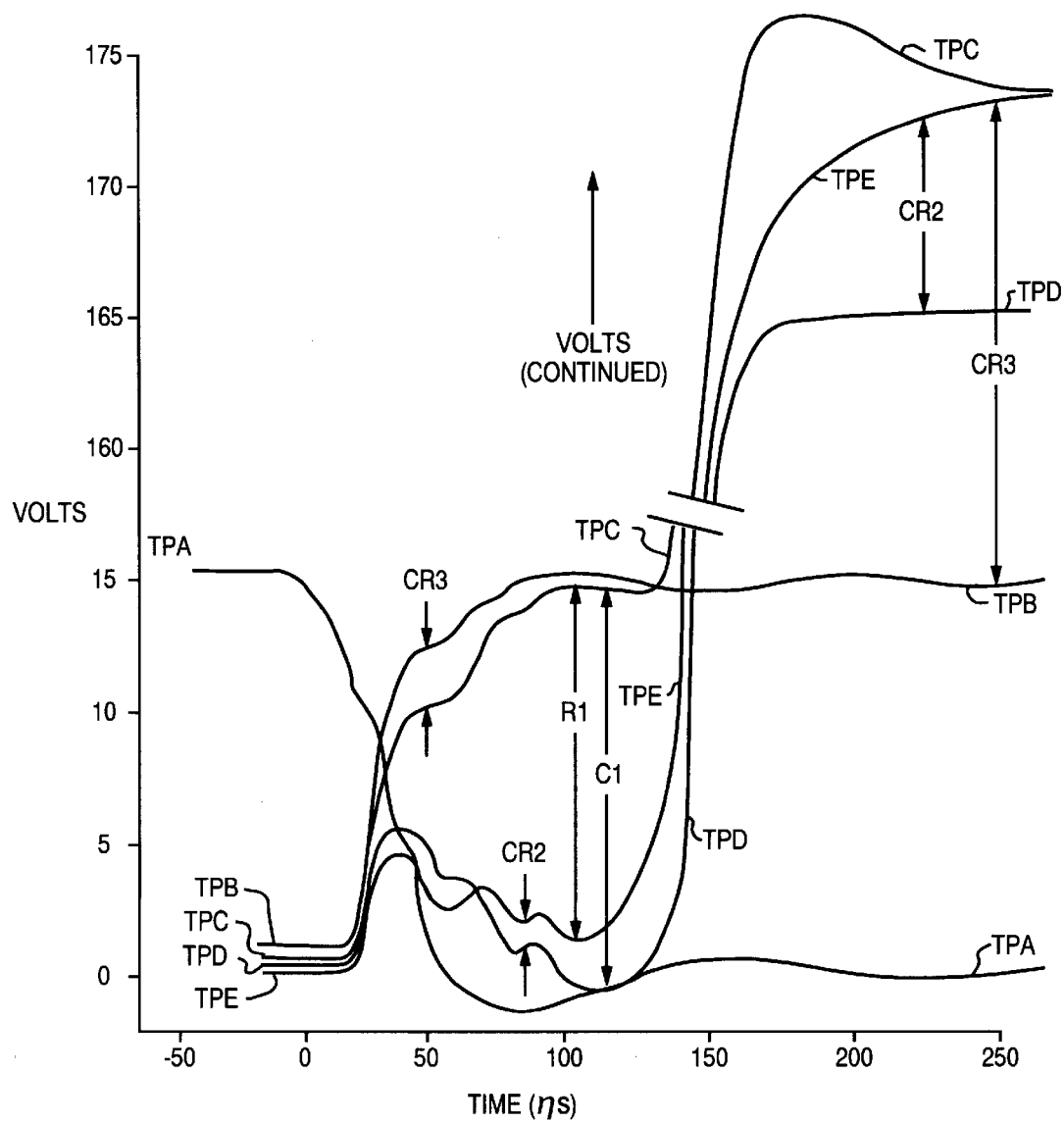
Figure 5A:
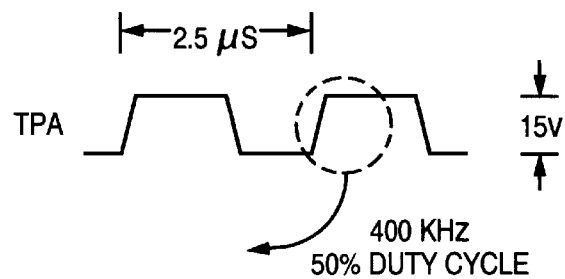
FIG. 5 is a graph of the voltage waveforms at specified points in the circuit of FIG. 3 showing an INPUT LOW-to-HIGH event.
Figure 5B:
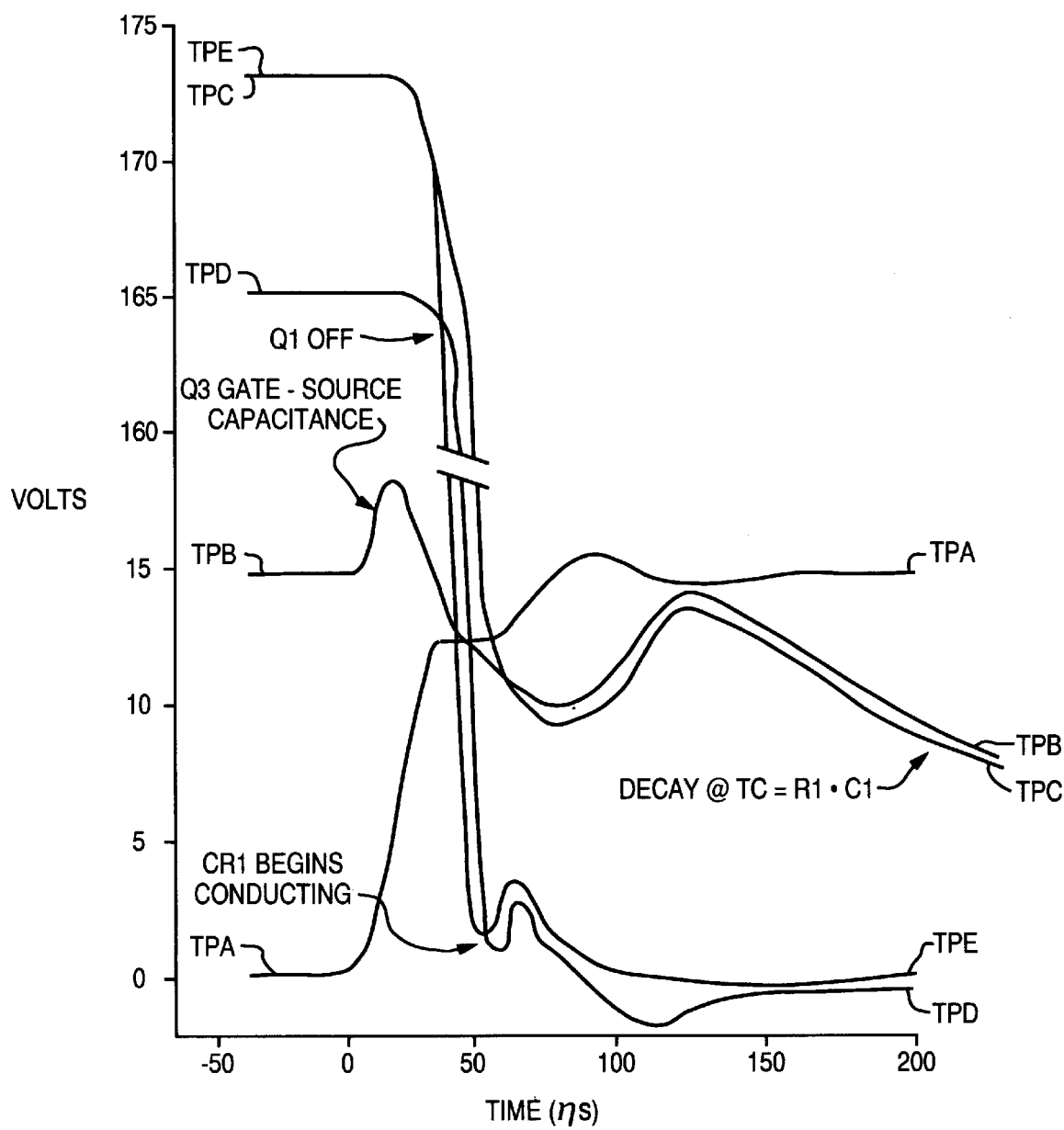

The Waveforms illustrated in FIG. 4 and 5 correspond to the matching test points in FIG. 3. These waveforms were sketched from observations made on an HP1740A oscilloscope with it's bandwidth limited to 20 MHz, and were edited by the inventor for clarity of salient features while eliminating dubious, or superfluous switching phenomenon. In FIG. 4, we see an INPUT HIGH-to-LOW transition, while FIG. 5 shows an INPUT LOW-to-HIGH transition.

Note the vertical scale is broken between 15 and 160 volts, and that the interval between the two transitions may be arbitrary. Encircled letters in FIGS. 4 and 5 correspond to the test points indicated by the corresponding encircled letter in FIG. 3. Where relevant, voltage potentials across individual components are indicated.

Examining the INPUT HIGH-to-LOW event in FIG. 4, the trace (A) represents the INPUT to the circuit, and all timing information in this event is referenced to INPUT crossing 15 volts. The MIC4422, a generic MOSFET gate driver IC, is capable of 25 ns switching while delivering 9 amps to a capacitive load. This performance is essential to rapidly charge/discharge the GATE-SOURCE capacitance's of Q2 and Q3. We can see a little 'shimmy' at about (25 ns, 10 v), this represents the 'Miller' capacitance of Q3, and is indicative of Q3 turning ON; this is reflected in the response of the dependent waveforms. The second shimmy at about (40 ns, 5 v) is Q2's Miller capacitance, indicating it has turned OFF, though evidence for this is less substantial; however, the circuit at this time is primed, and Q1 can now turn on at it's leisure (a leisurely 100 ns).

Waveform C-E represents the charge stored in C1. At about 100 ns it has reached about 15 volts. At the completion of the switching cycle, at about 200 ns, C1 continues to charge the GATE of Q1, which settles to about 8 volts greater than it's SOURCE. This charge loss of voltage from about 15 volts, to 8 volts is due to the charge required by Q1 GATE, and the reverse recovery charge of CR2, as well as distributed capacitance.

Waveform D-E represents the conduction of CR2 and Q2. With CR2 reverse biased, we are assured that neither CR2 nor Q2 are conducting. This condition permits charge from C1 to flow undiverted through R1 to the GATE of Q1. We can see this occurring at about (60 ns, 3 v), where signal E exceeds signal D, and increases until Q1 has turned ON at about 150 ns.

Examining an INPUT LOW-to-HIGH event in FIG. 5, this cycle begins with INPUT crossing about ½ volts, and all timing is referenced to this point. At about 25 ns, Q2 has turned ON, and the GATE of Q1 (E) drops immediately to less than Q1's SOURCE (D) assuring us it is OFF. Waveforms B and C continue to decay with a time-constant dependent on R1-C1.

In summary, this embodiment illustrates that the power output transistors cannot conduct simultaneously, that the conduction of the half-bridge is controlled by the conduction of the lower, logic referenced transistor (Q2), that all essential half-bridge function are accomplished within the body of this invention, and that these are accomplished with unprecedented speed, simplicity, and reliability. This circuit would find wide acceptance where traditional half-bridge circuits have been employed, or where cost or circuit complexity have prohibited their utilization in the past; and where design objectives are to maximize switching performance, improve reliability and efficiency, while reducing costs.

As will be readily apparent to the skilled practitioner, there are many other possible variants and applications within the scope of the invention. As an example, in applications where the output needs to remain in a high impedance state, the two common gates shared by Q2 and Q3 would need to be operated independently. That is, referring to FIG. 3, Q2 and Q3 would need to have separate and independent MOSFET gate drivers so that Q2 and Q3, and thus Q1, can be turned OFF simultaneously, resulting in a high output impedance. This embodiment is never-the-less within the scope of the invention.

As another example, referring again to FIG. 3, diode CR1 is provided to satisfy the current requirements of inductive loads for when Q1 is turned OFF. However, diode CR1 may exhibit reverse recovery characteristics, increasing power dissipation and reducing efficiency. CR1 may be replaced by a MOSFET similar to Q2 with it's GATE driven in parallel to Q2. This alternate component would eliminate the reverse recovery penalty of the diode in this point in the circuit. Future diode developments will improve diode reverse recovery characteristics.

As yet another example, referring again to FIG. 3, Q1 may not remain ON indefinitely, due to reverse leakage current primarily through CR2, which will discharge C1. However, under circumstances where Q1 needs to remain ON indefinitely, the designer may incorporate other means to supplement this lost charge on C1 using charge pump, or other techniques. This technique does not supplant any function(s) of this invention, but rather broadens it's utility.

Figure 6:
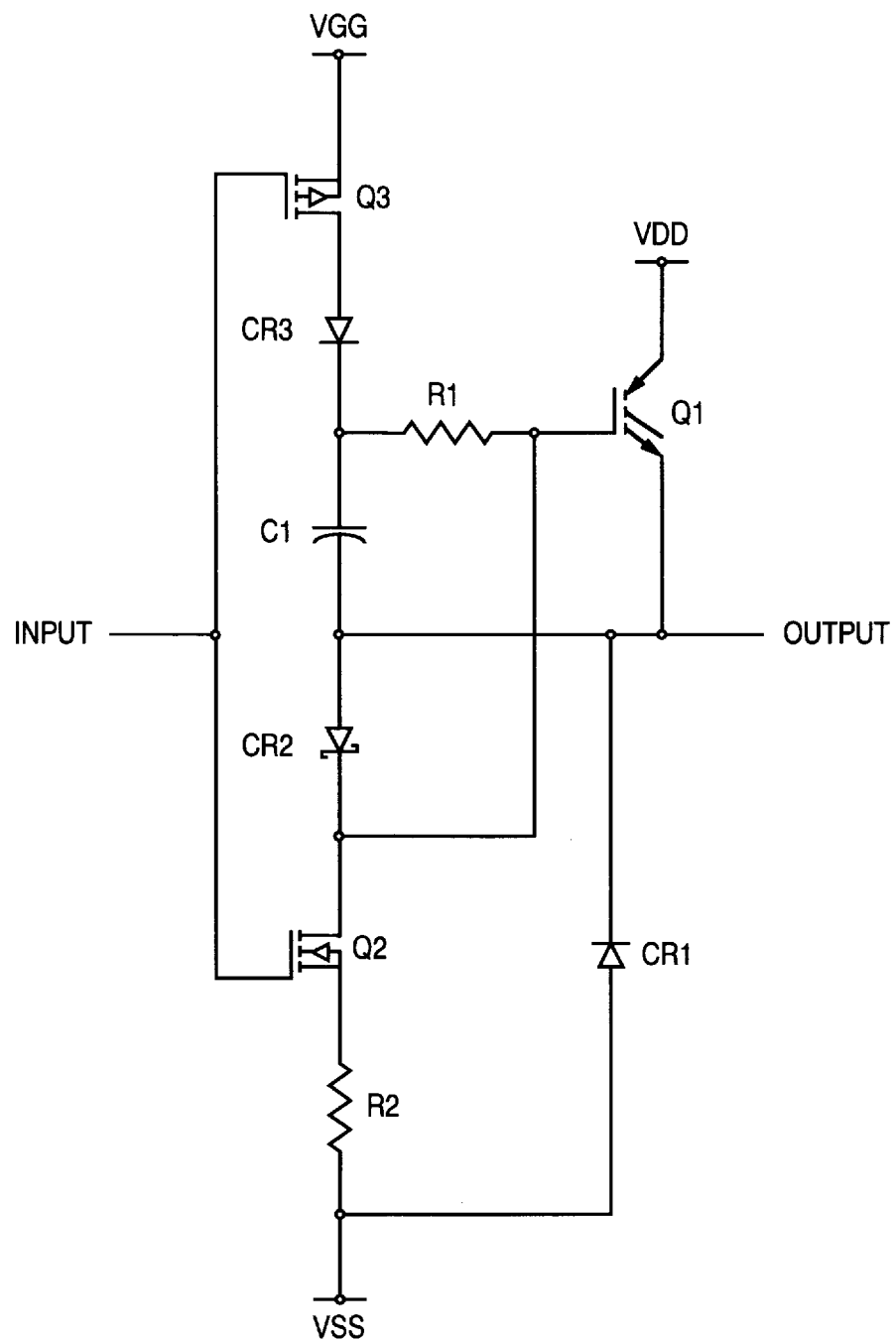
FIG. 6 a schematic of an interlocked half-bridge configuration used as a high-side driver for an Insulated Gate Bipolar Transistor (IBGT).

As still yet another example, FIG. 6 shows an interlocked half-bridge configuration used as a high-side driver for an Insulated Gate Bipolar Transistor (IGBT) popular in high voltage/current applications because of their low conduction losses. This circuit can be used as a high-side driver, where the circuit is intended only to conduct source current through the high-side transistor. In this application, the low-side transistor is will not carry load current, and is used only to generate bootstrap voltages for the high-side transistor. IGBTs have both the advantages and disadvantages of both bi-polar transistors, and MOSFETs. The advantages are a relatively fixed on-state voltage drop at any voltage, due to minority carrier conduction—thus making device power dissipation proportional to device current; zero DC gate current; and rapid turn-on. The disadvantages are a relatively slow turn-off due to 'tail current' as a result of minority carrier recombination lifetimes.

Bi-polar transistors being current controlled, require further circuit modifications or components to provide adequate turn-on charge.

Because an IGBT cannot turn-off instantaneously, as a MOSFET could, the interlocked half-bridge circuit would exhibit shoot-through when driving a high-side IGBT during turn-off. This shoot-through can be managed, however, by limiting the current in the low-side transistor (Q2) using source resistor R2.

R2 would cause Q2 to operate as a constant current sink. This sink current must be adequate to charge/discharge bootstrap capacitor C1 in a reasonable time during turn-on/off; but be small enough to limit power dissipation during Q1 'tail current' decay.

Because an IGBT switches inherently slower than a MOSFET, and because we are incurring additional losses due to turn-off 'tail current', this configuration would be limited to lower frequency operation (perhaps <50 kHz). Additionally, because the 'tail current' duration is indeterminate, the designer must incorporate a deadtime interval if a low-side power device is to be subsequently switched-in; or monitor the 'tail current' across R2, to determine when the IGBT has stopped conducting.

Because Q2 and CR3 will have to withstand VDD while Q1 is conducting, both must also be rated for the operating voltage.

Figure 7:
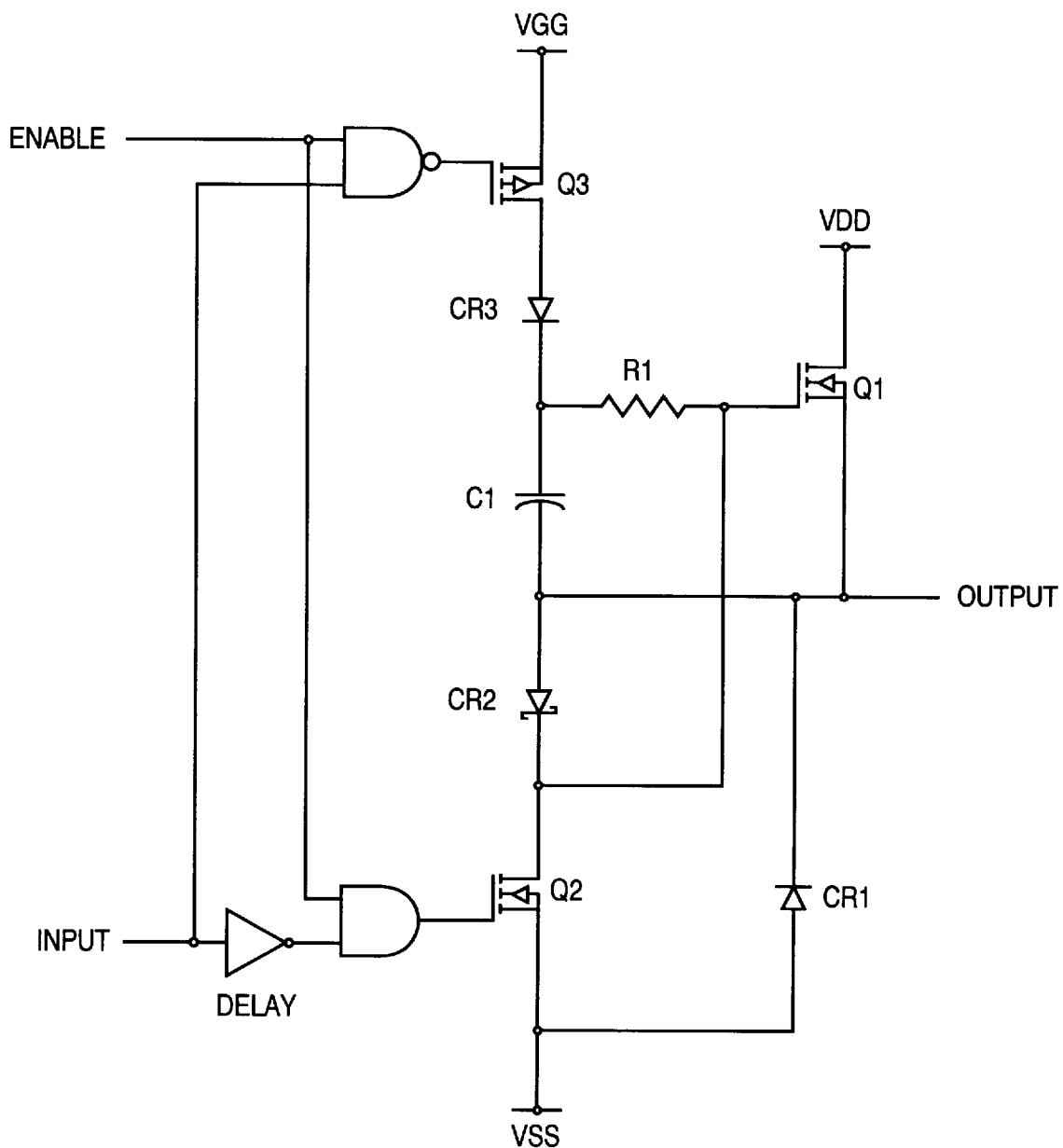
FIG. 7 is a schematic of a circuit of the invention configured for independently driving the output transistors.

As a further example, FIG. 7 shows a circuit utilizing logic circuits to control the output transistors. The classic circuit, where both the p-channel pilot transistor Q3 and the low side power transistor Q2 share a common gate, cannot be driven independently. The ability to independently drive both transistors is desirable where a high impedance state is desired for the output, such as an output short-circuit, or some control schemes.

Many techniques exist, and the most flexible would employ logic circuits such as illustrated in FIG. 7. In this example, if ENABLE is high, then both Q3 and Q2 inputs will follow the level of INPUT. If ENABLE is low, however; the gate of Q3 will be driven high, turning it off; and the gate of Q2 will be driven low, turning it off.

Figure 8:
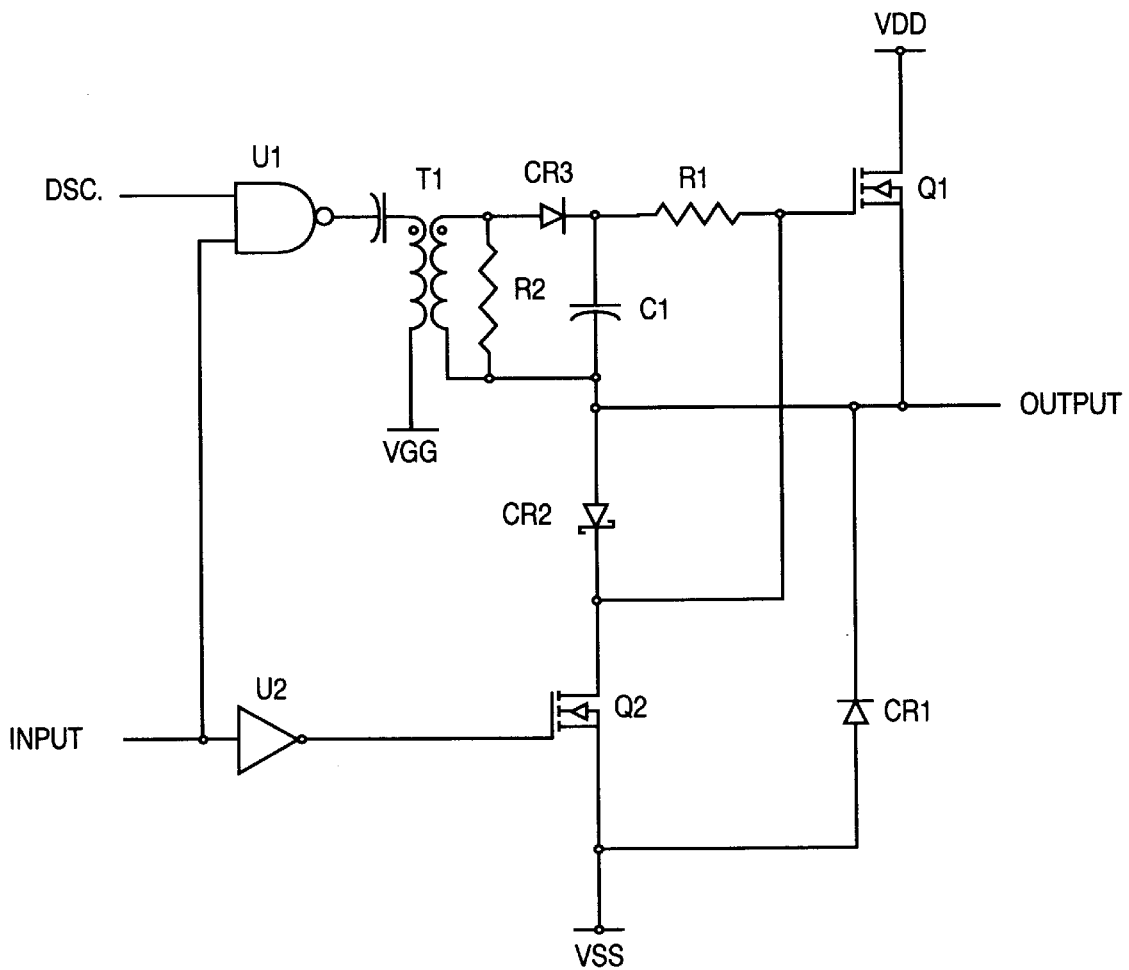
FIG. 8 is a schematic of a circuit of the invention with logic circuits controlling the state of the drivers.

As a yet further example, the circuit of FIG. 8 utilizes a transformer to isolate the high side driver. Since the high-side transistor on-time is limited by leakage currents which will eventually discharge bootstrap capacitor C1, a means of supplementing lost charge would enable the high-side transistor to remain on indefinitely.

FIG. 8 shows a means to drive the high-side transistor which will replace lost charge on C1 due to leakage currents, and functions as follows:

a) When INPUT is low, the high-side driver U1 will be gated off, and through inversion will turn the low-side transistor Q2 off.

b) When INPUT is high, U1 will gate the oscillator to drive coupling transformer T1 to deliver charge to the bootstrap capacitor through CR2. R2 is provided to facilitate flyback currents, and may be replaced with a diode.

c) As long as input is high, transformer T1 will be coupling any lost charge to the bootstrap capacitor, permitting unlimited high-side on-time duration.

The objects and advantages of the invention may be further realized and attained by means of the instrumentality's and combinations particularly pointed out in this and all priority applications, and the appended claims. Accordingly, the drawings and description are to be regarded as illustrative in nature, and not as restrictive.

I claim:

1. A half-bridge circuit for commutating two series n-type transistors from a direct current supply voltage to a common output load, whereby simultaneous conduction of both n-type transistors is precluded, said circuit comprising:

a) a high-side transistor and a low-side transistor connected in series through a first diode, with a high-side transistor drain connected to a higher voltage, and a low-side transistor source connected to a lower voltage;

b) a cathode of said first diode connected to a low-side transistor drain, and an anode of said first diode connected to high-side transistor source;

c) the drain of the low-side transistor connected to a high-side transistor gate;

d) an output signal from the high-side transistor source;

e) an input signal to the low-side transistor gate; and f) a means for providing control voltages to the high-side transistor.

2. A half-bridge circuit as described in claim 1 wherein said means for providing includes a capacitor.

3. A half-bridge circuit for commutating two series n-type transistors from a direct current supply voltage to a common output load, whereby simultaneous conduction of both n-type transistors is precluded, and containing a bootstrap section, said circuit comprising:

a) a high-side transistor and a low-side transistor connected in series through a first diode, with a high-side transistor drain connected to a higher voltage, and a low-side transistor source connected to a lower voltage;

b) a cathode of said first diode connected to a low-side transistor drain, and an anode of said first diode connected to high-side transistor source;

c) the drain of the low-side transistor connected to a high-side transistor gate;

d) an output signal from the high-side transistor source;

e) an input signal to the low-side transistor gate;

f) a capacitor with a first end connected to the high-side transistor source, and a second end connected to a first end of a resistor;

g) the resistor with a second end connected to the high-side transistor gate; and h) a cathode of a second diode connected to the first end of the resistor, and an anode of the second diode connected to a gate drive voltage source.

4. The half-bridge circuit of claim 3, with a means of switching in said high side transistor gate, comprising:

a) a p-type transistor with it's source connected to said gate drive voltage source, it's drain connected to the anode of said second diode; and b) the gate of said p-type transistor connected to a driver wherein said driver provides control signals for said p-type transistor and said low-side transistor.

5. The half-bridge circuit of claim 4, wherein said driver is dependently connected to said p-type transistor and said low-side transistor.

6. The half-bridge circuit of claim 4, wherein a first independent driver is connected to said p-type transistor and a second independent driver is connected to said low-side transistor.

7. The half-bridge circuit of claim 3, wherein the transistors are selected from the group consisting of MOSFET's, IGBT's, and bi-polar transistors.

8. The half-bridge circuit of claim 3, wherein voltage and device polarities are reversed.

9. A half-bridge circuit for driving a single floating Insulated Gate Bipolar Transistor (IGBT) comprising:

a) a high-side IGBT with a high-side IGBT collector connected to a higher voltage;

b) an n-type MOSFFT with an n-type MOSFET source connected to a lower voltage;

c) a diode connecting the IGBT transistor to the n-type MOSFET, wherein the diode anode is connected to an IGBT emitter, and the diode cathode is connected to an n-type MOSFET drain;

d) the n-type MOSFET drain connected to the IGBT gate;

e) a resistor connected to the n-type MOSFET source;

f) an output connected to the IGBT emitter; and g) an input applied to the n-type MOSFET gate.

* * * * *